United States Patent [19]

Ozaki

[11] Patent Number: 4,817,280
[45] Date of Patent: Apr. 4, 1989

[54] METHOD OF MANUFACTURING PRINTED CIRCUIT BOARDS

[75] Inventor: Risuke Ozaki, Kokubunji, Japan

[73] Assignee: O. Key Printed Wiring Co., Ltd., Tokyo, Japan

[21] Appl. No.: 871,910

[22] Filed: Jun. 9, 1986

[30] Foreign Application Priority Data

Jun. 10, 1985 [JP] Japan .................................. 60-124378
Dec. 2, 1985 [JP] Japan .................................. 60-269398

[51] Int. Cl.⁴ .............................................. H05K 3/10
[52] U.S. Cl. ........................................ 29/846; 29/830; 156/150; 174/68.5
[58] Field of Search ................. 29/830, 831, 846, 852; 156/150; 174/68.5; 427/97

[56] References Cited

U.S. PATENT DOCUMENTS 3,932,932  1/1976  Goodman ..................... 174/68.5 X
4,445,952  5/1984  Reynolds, III et al. ......... 156/150 X
4,496,793  1/1985  Hanson et al. .................... 29/830 X

FOREIGN PATENT DOCUMENTS 53-62174   6/1978  Japan ..................................... 29/831
54-35671  11/1979  Japan ..................................... 29/830

Primary Examiner—P. W. Echols
Assistant Examiner—Carl J. Arbes
Attorney, Agent, or Firm—Birch, Stewart, Kolasch & Birch

[57] ABSTRACT

The present invention relates to a method of manufacturing printed circuit boards.

The method of manufacturing printed circuit boards under the present invention is to provide holes on a metal plate, to attach a prepreg to the metal plate, and to fill the prepreg into the holes by heat-pressing the metal plate to which the prepreg is attached. Thereafter, lead wire holes are provided at the centers of prepreg filled the holes, and a resin plate having at least one circuit layer and through holes is glued to the metal plate. Alternately, a resin plate having at least one circuit layer and lead wire holes, or a resin plate having at least one circuit layer, through holes and lead wire holes are glued to the metal plate on the side where the prepreg is attached.

7 Claims, 5 Drawing Sheets

METHOD OF MANUFACTURING PRINTED CIRCUIT BOARDS

BACKGROUND OF THE INVENTION

1. Field of the Invention

The prsent invention relates to a method of manufacturing printed circuit boards.

2. Description of the Prior Art

A prior art printed circuit resin board having at least one circuit layer formed on the resin board is already known. As the miniaturization of electronic systems progress, however, a growing density of components mounted on the printed circuit board increases the heat generated from these mounted components. A resulting problem to be solved is the deteriorating performance of these mounted components due to a higher temperature in the adjacent area of the printed circuit resin board as a result of an insufficient heat releasing capacity of these printed circuit resin boards. To cope with this, components provided with radiation fins have been mounted, but a drawback was a higher cost of mounted components. As the number of mounted components increases, the printed circuit board arches slightly due to a lesser flexural rigidity of the printed circuit resin board, which makes it impossible to be incorporated in the electronic system. Even if it could be incorporated, it comes in contact with neighboring printed circuit boards and occasionally seriously jeopardizes the circuit function. Moreover, generation of noise cannot be avoided, as the printed circuit resin board has a poor shielding effect.

Therefore, offered in U.S. patent application Ser. No. 691,611, is a printed circuit board in which a metal board and a resin board are glued together by means of a bonding sheet, holes which are filled with resin are provided on the metal board, lead wire holes are provided at the centers of the resin filled the holes, and at least one circuit layer and through holes are formed on the resin board.

In this printed circuit board, its better heat releasing capacity facilitates a higher density of mounted components, while there is no deterioration in the functions of the mounted components even though the heat value generated from the mounted components is greater, and costly mounted components with radiation fins and the like are unnecessary. Also its greater flexural rigidity gives no chance of arching to the printed circuit board even if the number of the mounted components increases, so that insertion of the printed circuit board into the electronic system can be made with much ease, and the inserted printed circuit board does not come into contact with neighboring printed circuit boards. Further, its better shielding effect facilitates prevention of noises. Therefore, it is possible to widely expand the applicable scope of printed circuit boards.

Following is an explanation of the conventional method of manufacturing such printed circuit boards hereinafter. First, holes are provided on a metal board material, resin is filled into the holes, the resin is then hardened, lead wire holes are provided at the centers of the resin filled holes, a resin board material having at least one circuit layer and through holes thereon is glued to the metal board material by means of a bonding sheet, and finally printed circuit boards are made from the the metal board material being and the resin board material glued together and by finishing their outer configurations.

In present methods of manufacturing printed circuit boards, which requires filling resin into the holes of each metal board and further hardening the resin, the manufacturing operation is troublesome and long while the productivity is rather poor.

SUMMARY OF THE INVENTION

An object of the present invention is to provide an easy method of manufacturing printed circuit boards.

Another object of the present invention is to provide a high productivity method of manufacturing printed circuit boards.

The method of manufacturing printed circuit boards according to the present invention is characterized in that holes are provided in a metal plate such as a metal board material, a prepreg is attached to the metal plate, the prepreg is filled into the holes by heat-pressing the metal plate to which the prepreg is attached, lead wire holes are provided at the centers of the prepreg filled holes, and a resin plate such as a resin board material having at least one circuit layer and at least either through holes or lead wire holes is glued to the metal plate on its side where the prepreg is attached.

In such a method of manufacturing printed circuit boards, it is possible to fill prepreg into holes of a number of metal plates at one time, so that the time required for the manufacturing process becomes shorter and productivity increases.

DETAILED DESCRIPTION OF THE INVENTION

Figure 6:
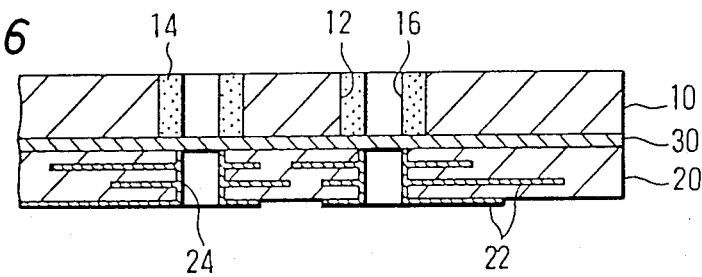
FIG. 6 shows a cross-sectional view of the printed circuit board; manufactured by the present invention
Figure 7A:
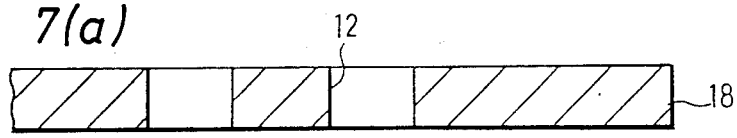
FIG. 7 is directed to a conventional manufacturing method for printed circuit boards.
Figure 7B:
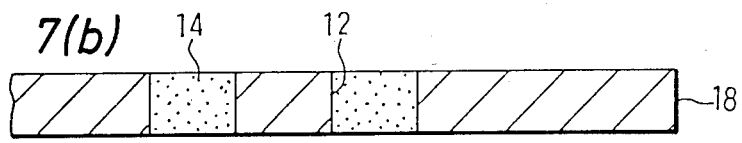
Figure 7C:
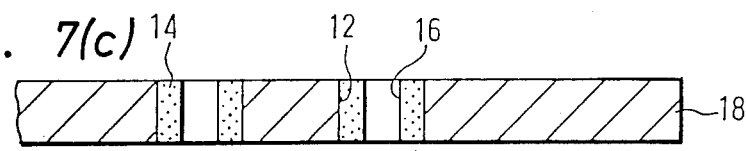
Figure 7D:
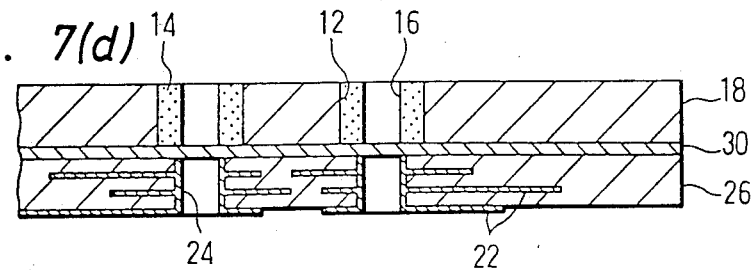

Following is a description of on the printed circuit board according to FIG. 6. A metal board 10 and a resin board 20 are glued together by means of a bonding sheet 30, holes 12 are provided in the metal board 10, resin 14 is filled into the holes 12, lead wire holes 16 are provided at the centers of the resin 14 filled holes 12, and circuit layers 22 and through holes 24 are formed on the resin board 20.

Next is a description in accordance with FIG. 7 relating to a conventional manufacturing method for the printed circuit boards shown in FIG. 6. First, holes 12 are provided on a metal board material 18 (FIG. 7(*a*)). Next, resin 14 is filled into the resin holes 12 by squeegee or roller and the resin 14 is hardened by heat-drying or by ultraviolet rays (FIG. 7(b)). Next, lead wire holes 16 are provided at the centers of the resin 14 filled holes 12 (FIG. 7(c)). Next, a resin board material 26 having circuit layers 22 and through holes 24 is glued to the metal board material 18 by means of a bonding sheet 30 (FIG. 7(d)). Finally, printed circuit boards are made by bonding together the metal board material 18 and the resin board material 26 and finishing their outer configuration with a press machine or router.

FIG. 1 is a manufacturing method for printed circuit boards according to one embodiment of the present invention. First, holes 12 are provided in a metal board material 18 (FIG. 1(a)). Next, a prepreg 40 is attached to the metal board material 18 (FIG. 1(b)). Next, by heat-pressing multiple layers of metal board materials 14 to each of which the prepreg 40 is attached, the prepreg 40 fills into the holes 12 (FIG. 1(c)). Next, an adhesive sheet 50 attached to a release paper 60 is also attached to the prepreg 40 (FIG. 1(d)). Next, lead wire holes 16 are provided at the centers of the prepreg 40 filled in the holes 12 (FIG. 1(e)). Next, metal boards 10 are made from the metal board material 18 by finishing their outer configuration with a press machine or router (FIG. 1(f)). Next, the release paper 60 is detached from the metal board 10 (FIG. 1(g)). After forming circuit layers 22 and through holes 24 on resin board material, resin boards 20 are made from the resin board material by finishing their outer configurations with a press machine or router, and the metal board 10 is glued by pressing the adhesive sheet 50 to the resin board 20 after the position is identified by guide holes (not shown in the drawing) so as to put the respective centers of the lead wire holes 16 and the through holes 24 on identical lines (FIG. 1(h)).

Figure 2A:
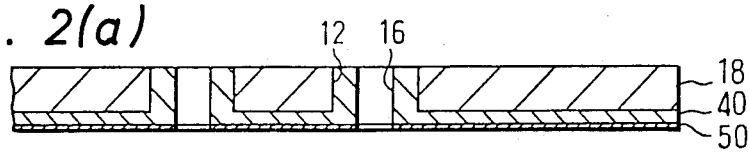
FIG. 2 is a manufacturing method for printed circuit boards according to a second embodiment of the present invention.
Figure 2B:
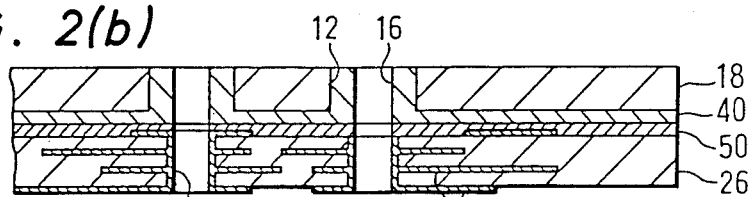
Figure 2C:
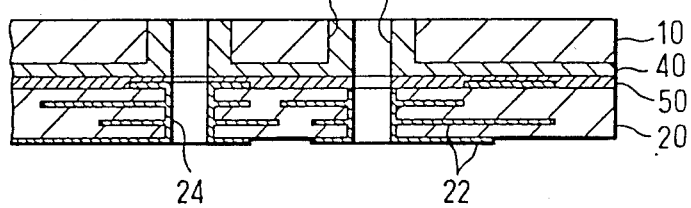

FIG. 2 is a manufacturing method for printed circuit boards according to a second embodiment of the present invention. First, starting from the step shown in FIG. 1(e), the release paper 60 is detached (FIG. 2(a)). At the same time, circuit layers 22 and through holes 24 are formed on a resin board material 26 and the metal board material 18 is glued to the resin board material 26 by means of the adhesive sheet 50 (FIG. 2(b)). Printed circuit boards are made out of the glued-together metal board material 18 and resin board material 26 by finishing their outer configurations (FIG. 2(c)).

Figure 1A:
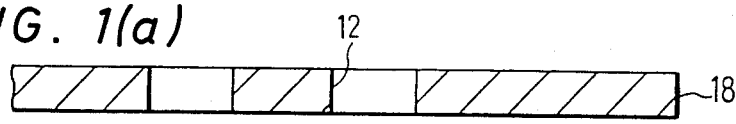
FIG. 1 is a manufacturing method for printed circuit boards according to a first embodiment of the present invention.
Figure 1B:
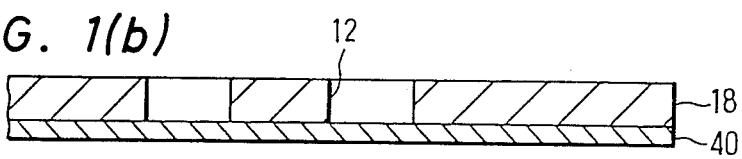
Figure 1C:
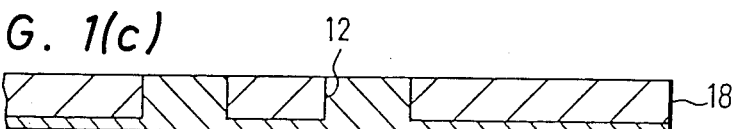
Figure 1D:
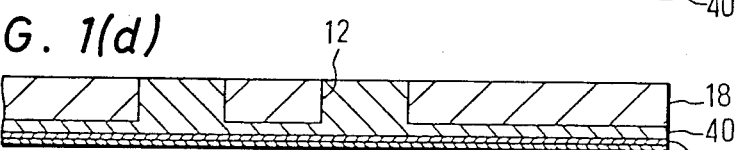
Figure 1E:
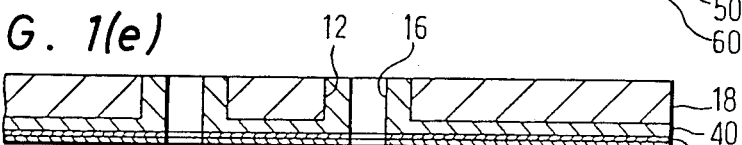
Figure 1F:
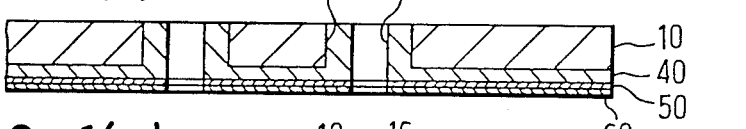
Figure 1G:
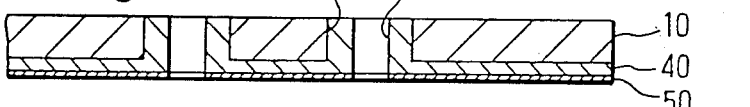
Figure 1H:
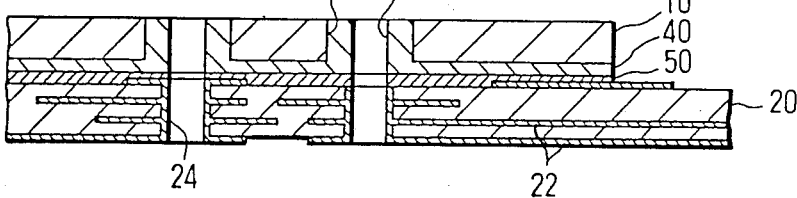
Figure 3A:
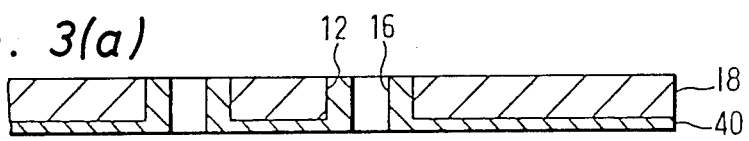
FIG. 3 is a manufacturing method for printed circuit boards according to a third embodiment of the present invention.
Figure 3B:
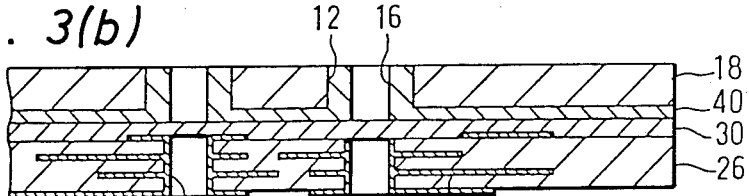
Figure 3C:
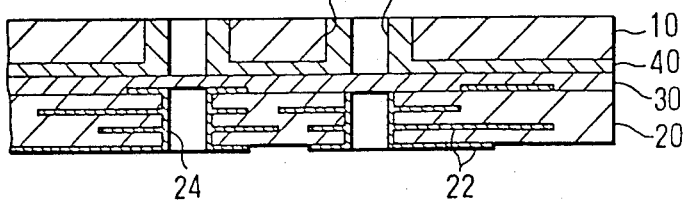
Figure 4A:
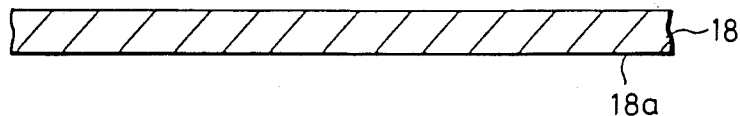
FIG. 4 is a manufacturing method for printed circuit boards according to a fourth embodiment of the present invention.
Figure 4B:
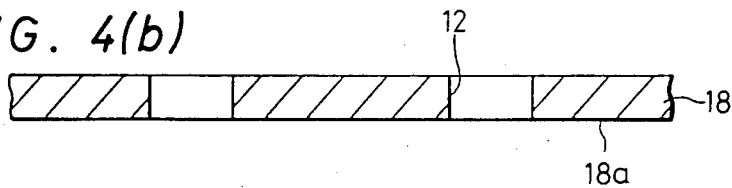
Figure 4C:
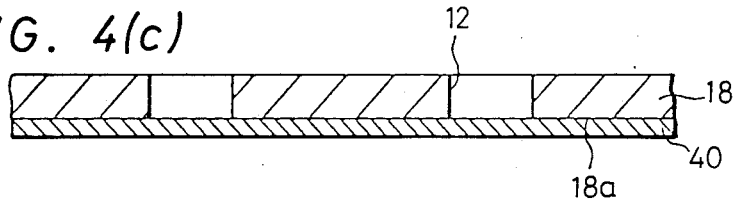
Figure 4D:
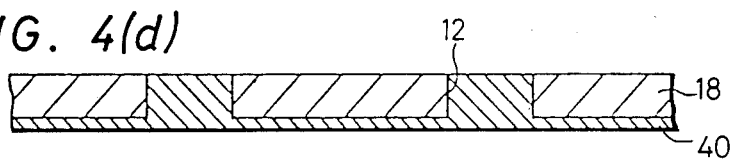
Figure 4E:
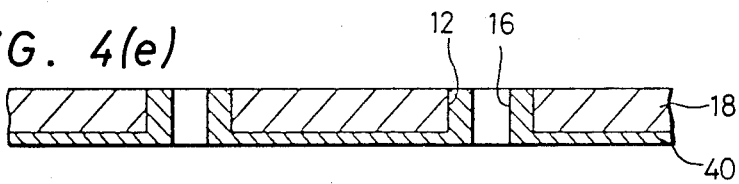
Figure 4F:
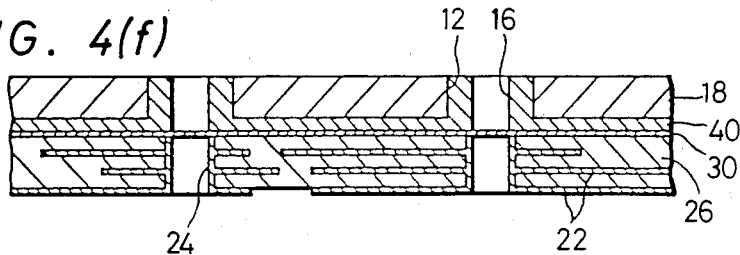
Figure 5A:
FIG. 5 is a manufacturing method for printed circuit boards according to a fifth embodiment of the present invention.
Figure 5B:
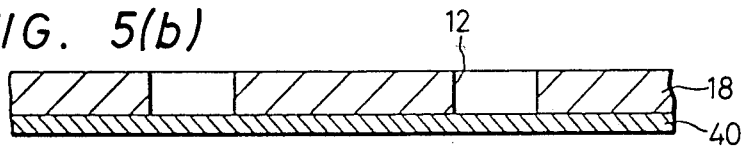
Figure 5C:
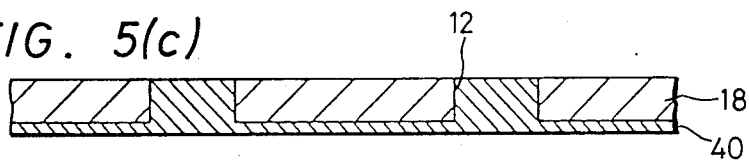
Figure 5D:
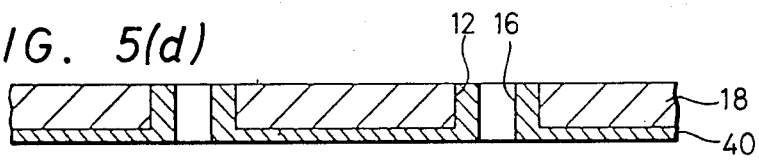
Figure 5E:
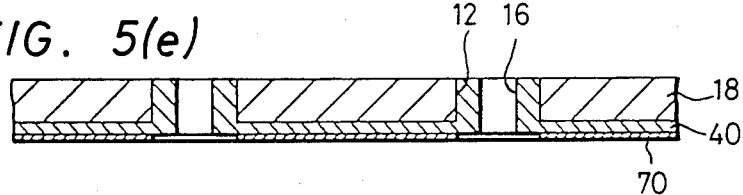
Figure 5F:
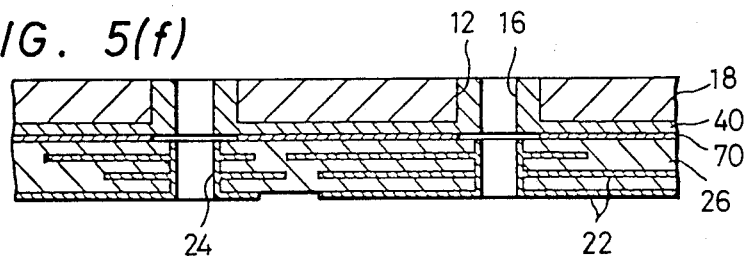

FIG. 3 is still another method of manufacturing printed circuit boards according to the present invention. As shown in FIG. 1(c), lead wire holes 16 are provided at the centers of the prepreg 40 filled holes 12 (FIG. 3(a)). Next, the metal board material 18 is glued to a resin board material 26 by means of a bonding sheet 30 (FIG. 3(b)). Next, printed circuit boards are made with the glued-together metal board material 18 and resin board material 26 by finishing their outer configurations (FIG. 3(c)).

FIG. 4 is a further method of manufacturing printed circuit boards according to the present invention. First, after sand paper polishing one side 18a of an aluminum metal board material 18, an alumite seal treatment is effected on the side 18a (FIG. 4(a)). Next, holes 12 are provided on the metal board material 18 (FIG. 4(b)). Next, a prepreg 40 is attached to side 18a of the metal board material 18 (FIG. 4(c)). Next, by heat-pressing multiple layers of the metal board material 18, to which the prepreg 40 is attached, with a multilayer press machine, the prepreg 40 fills into the holes 12 (FIG. 4(d)). Next, lead wire holes 16 are provided at the centers of the prepreg 40 filling the holes 12 (FIG. 4(e)). Next, after adjusting the position by guide holes (not shown) so as to put the respective centers of the lead wire holes 16 and through holes 24 on identical lines, the side of the metal board material 18 on which the prepreg 40 is attached is glued to a resin board material 26 by pressing against a bonding sheet 30 (FIG. 4(f)). Next, printed circuit boards are made from the glued-together metal board material 18 and the resin board material 26 by finishing their outer configurations.

FIG. 5 is a still further method of manufacturing printed circuit boards according to the present invention. First, after providing holes 12 on a metal board material 18 made from aluminum, an alumite sealing treatment is effected on both sides of the metal board material 18 and the inner wall of the holes 12 (FIG. 5(a)). Next, a prepreg 40 is attached to the metal board material 18 (FIG. 5(b)). Next, by heat-pressing multiple layers of metal board materials 18 to which the prepregs 40 are attached, the prepreg 40 fills into the holes 12 (FIG. 5(c)). Next, lead wire holes 16 are provided at the centers of the prepreg 40 filled holes 12 (FIG. 5(d)). Next, an adhesive 70 is applied to the surface of the prepreg 40 by silk-screen printing leaving the lead wire hole area free of adhesive (FIG. 5(e)). Next, after adjusting the position by guide holes (not shown) so as to put the respective centers of the lead wire holes 16 and through holes 24 on identical lines, the metal board material 18 is glued by being pressed to a resin board material 26 having the adhesive 70 (FIG. 5(f)). Next, printed circuit boards are made from the glued-together metal board material 18 and the resin board material 26 by finishing their outer configurations.

In these methods of manufacturing printed circuit boards, since the prepreg 40 is attached to the metal board material 18 on which the resin holes 12 are provided, and the prepreg 40 can be filled into the resin holes 12 of the metal board material 18 by heat-pressing the metal board material 18 to which the prepreg 40 is attached, it facilitates filling the prepreg 40 into the resin holes 12 on a plural number of metal board materials 18 at one time, so that the time required for manufacturing becomes much shorter and the manufacture is easier. Also, in the method of manufacturing printed circuit boards explained by FIGS. 1 through 3, an insulating layer is formed all on the side of the metal board 10 where the resin board 20 is attached by gluing the metal board 10 and the resin board 20 together with the prepreg 40, so that an effective insulation is maintained between the metal board 10 and the circuit layer 22 formed over the surface of the resin board 20 where the metal board 10 is attached, and this makes it possible to provide a printed circuit board of a high reliability. Further, in the method of manufacturing printed circuit boards as explained by FIGS. 4 and 5, since roughening treatment is effected on one side 18a of the metal board material 18 or on both sides of the metal board material 18 and the inner wall of the resin hole 12, a strong adhesion between the metal board 10 and the prepreg 40 makes it possible to get a printed circuit board of a high reliability.

Furthermore, in the aforesaid methods of manufacturing printed circuit boards, the prepreg 40 is attached to the metal board material 18 on which the resin holes 12 are provided and the metal board material 18 to which the prepreg 40 is attached is glued by heat-pressing, but the same can well be accomplished by attaching the prepreg 40 to the metal board 10 having the resin holes 12 provided thereon and heat-pressing such metal board 10 to which the prepreg 40 is attached. Moreover, as for the metal plate namely the metal board material 18 or the metal board 10, a plate made from any kind of metal, for example aluminum plate, aluminum alloy plate, copper plate and steel plate, can also be employed. Also, in the aforesaid manufacturing methods, although the circuit layers 22 are formed in a multiple layer structure on the resin plate, namely the resin board material 26 or the resin board 20, the circuit layer can side be formed on one side or both sides of the resin plate, and in case where the circuit layer is formed only on one side of the resin plate, the lead wire holes can be provided in the resin plate. Also, in the aforesaid manufacturing methods, although the metal plate is glued to the resin plate with the adhesive sheet 50, the bonding sheet 30 or the adhesive 70, the metal plate can also be glued to the resin plate by means of a prepreg. Also, in the aforesaid manufacturing methods, although the prepreg 40 is attached to the metal board material 18 and the metal board material 18 to which the prepreg 40 is attached is heat-pressed together, the same can well be accomplished by attaching the prepreg 40 and an epoxy resin board to the metal board material on which the resin holes 12 are provided and heat-pressing the metal board material 18 to which the prepreg 40 and the epoxy resin board are attached. Also, in the aforesaid manufacturing method, the metal board 10 or the metal board material 18 is attached to the resin board 20 or the resin board material 26 by pressing them together, but can instead be done by gluing by heat-pressing, or by natural drying as well. The present invention is therefore applicable to the manufacture of flexible printed circuit boards. Also, if the same NC tape is employed for providing the resin holes 12 and the lead wire holes 16, the lead wire holes 16 can be provided exactly at the centers of the resins holes 12 with utmost precision. Also, in the manufacturing method explained according to FIGS. 4 and 5, although roughening treatment is effected on one side 18a of the metal board material 18 or both sides of the metal board material 18 and the inner wall of the resins holes 12, it suffices to effect roughening treatment at least on the side of the metal board material 18 where the prepreg 40 is to be attached. Also, in the manufacturing method as explained by FIGS. 4 and 5, roughening by sandpaper or alumite sealing treatment is effective as roughening treatment, but use of at least either a mechanical roughening treatment or chemical roughening treatment is sufficient. Also, in the manufacturing method as shown by FIG. 5, although adhesive 70 is applied on the surface of the prepreg 40, the adhesive 70 can be applied on the surface of the resin board material 26. Also, in the manufacturing method explained by FIG. 5, adhesive 70 is applied on the surface of the prepreg 40 by silk screen printing leaving the area of the lead wire holes 16 uncovered, but the adhesive 70 can also be applied by spraying on the whole surface of the prepreg 40 or the whole surface of the resin board material 26.

What is claimed is:

1. A method of manufacturing printed circuit boards comprising the steps of:
    (a) providing holes on a metal plate;
    (b) attaching a prepreg to said metal plate;
    (c) filling said prepreg into said holes by heat-pressing said metal plate to which said prepreg is attached;
    (d) providing lead wire holes at the centers of the prepreg filled holes; and
    (e) gluing a resin plate having at least one circuit layer, and having either through holes or lead wire holes, to the side of said metal plate where said prepreg is attached.

2. The method of claim 1, further including the steps of:
    (a) attaching an adhesive sheet and a release paper to said prepreg;
    (b) forming lead wire holes at the centers of the prepreg filled holes;
    (c) processing metal boards from said metal plate by shaping their outer configurations;
    (d) detaching said release paper from said metal board; and
    (e) gluing said metal board to a resin board which is provided with at least one circuit layer and either of through holes or lead wire holes with said adhesive sheet.

3. The method of claim 1, further including the steps of:
    (a) attaching an adhesive sheet and a release paper to said prepreg;
    (b) forming lead wire holes at the centers of the prepreg filled holes;
    (c) detaching said release paper from said metal plate; and
    (d) gluing said metal plate to a resin board material having at least one circuit layer and either through holes or lead wire holes with said adhesive sheet.

4. The method of claim 1, further including the steps of:
    (a) forming lead wire holes at the centers of the prepreg filled holes; and
    (b) gluing said metal plate to a resin board material having at least one circuit layer and either through holes or lead wire holes by a bonding sheet.

5. The method of claim 1, further including the steps of:
    (a) providing a roughening treatment on at least one side of said metal plate;
    (b) attaching said prepreg to the side of said metal plate where the roughening treatment is effected; and
    (c) heat pressing said metal plate to which said prepreg is attached.

6. The method of claim 5 in which said step of providing a roughening treatment occurs prior to said step of forming said lead wire holes.

7. The method of claim 5 in which said step of providing a roughening treatment occurs after said step of forming said lead wire holes.

* * * * *